US012581762B2

(12) United States Patent
Tsai et al.

(10) Patent No.: US 12,581,762 B2
(45) Date of Patent: Mar. 17, 2026

(54) ENHANCED TRENCH ISOLATION STRUCTURE

(71) Applicant: Taiwan Semiconductor Manufacturing Company, Ltd., Hsinchu (TW)

(72) Inventors: Min-Ying Tsai, Kaohsiung City (TW); Cheng-Te Lee, Chupei City (TW); Rei-Lin Chu, Hsinchu City (TW); Ching I Li, Tainan (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 179 days.

(21) Appl. No.: 18/355,467

(22) Filed: Jul. 20, 2023

(65) Prior Publication Data

US 2024/0021642 A1    Jan. 18, 2024

Related U.S. Application Data

(62) Division of application No. 17/073,553, filed on Oct. 19, 2020, now Pat. No. 11,784,204.

(51) Int. Cl.
H10F 39/00 (2025.01)

(52) U.S. Cl.
CPC ......... H10F 39/807 (2025.01); H10F 39/014 (2025.01); H10F 39/028 (2025.01)

(58) Field of Classification Search
CPC ..... H10F 39/807; H10F 39/028; H10F 39/014
See application file for complete search history.

(56) References Cited

U.S. PATENT DOCUMENTS 5,724,151 A * 3/1998 Ryley ..................... G01N 21/00
                                                         356/432
7,202,899 B2 4/2007 Lin et al.
(Continued)

FOREIGN PATENT DOCUMENTS

CN          107768392 A      3/2018
EP          1489667 A2      12/2004

OTHER PUBLICATIONS

Sintering and microstructural investigation of gamma-alpha alumina powders by Yalamac et al, 2014.*
(Continued)

*Primary Examiner* — Mounir S Amer
*Assistant Examiner* — Alexander Belousov
(74) *Attorney, Agent, or Firm* — Eschweiler & Potashnik, LLC

(57)          ABSTRACT

The present disclosure relates to an image sensor comprising a substrate. A photodetector is in the substrate. A trench is in the substrate and is defined by sidewalls and an upper surface of the substrate. A first isolation layer extends along the sidewalls and the upper surface of the substrate that define the trench. The first isolation layer comprises a first dielectric material. A second isolation layer is over the first isolation layer. The second isolation layer lines the first isolation layer. The second isolation layer comprises a second dielectric material. A third isolation layer is over the second isolation layer. The third isolation layer fills the trench and lines the second isolation layer. The third isolation layer comprises a third material. A ratio of a first thickness of the first isolation layer to a second thickness of the second isolation layer is about 0.17 to 0.38.

20 Claims, 9 Drawing Sheets

100

(56) References Cited

U.S. PATENT DOCUMENTS

| | | |
|---|---|---|
| 2016/0225813 A1 | 8/2016 | Liao et al. |
| 2016/0276386 A1 | 9/2016 | Hsu et al. |
| 2018/0019276 A1 | 1/2018 | Miyanami |
| 2019/0131327 A1 | 5/2019 | Chou et al. |
| 2020/0006706 A1 | 1/2020 | Washio et al. |
| 2020/0058684 A1 | 2/2020 | Wu et al. |
| 2020/0295005 A1 | 9/2020 | Karda et al. |

OTHER PUBLICATIONS

Machine Translation of CN107768392 by Chen.*
Sun et al. "Backside Passivation for Improving the Noise Performance in CMOS Image Sensor." AIP Advances 10, 045229 (2020), published on Apr. 23, 2020.
ON Semiconductor. "Handling Procedures to Avoid Trapped Charges." Semiconductor Components Industries, LLC, published Oct. 2012.
Pawlik et al. "Electrical and Chemical studies on Al2O3 Passivation Activation Process." Energy Procedia 60 (2014), 85-89, published in 2014.
Deckers et al. "Aluminum Oxide-Aluminum Stacks for Contact Passivation in Silicon Solar Cells." Energy Procedia 55 (2014), 656-664, published in 2014.
Wang et al. "Passivation Properties of Atomic-Layer-Deposited Hafnium and Aluminum Oxides on Si Surfaces." IEEE Transactions on Electron Devices, vol. 59, No. 2, Feb. 2012.
Non-Final Office Action dated Dec. 9, 2022 for U.S. Appl. No. 17/073,553.
Notice of Allowance dated Jun. 14, 2023 for U.S. Appl. No. 17/073,553.

* cited by examiner

200

900

1000

1400 ⟋

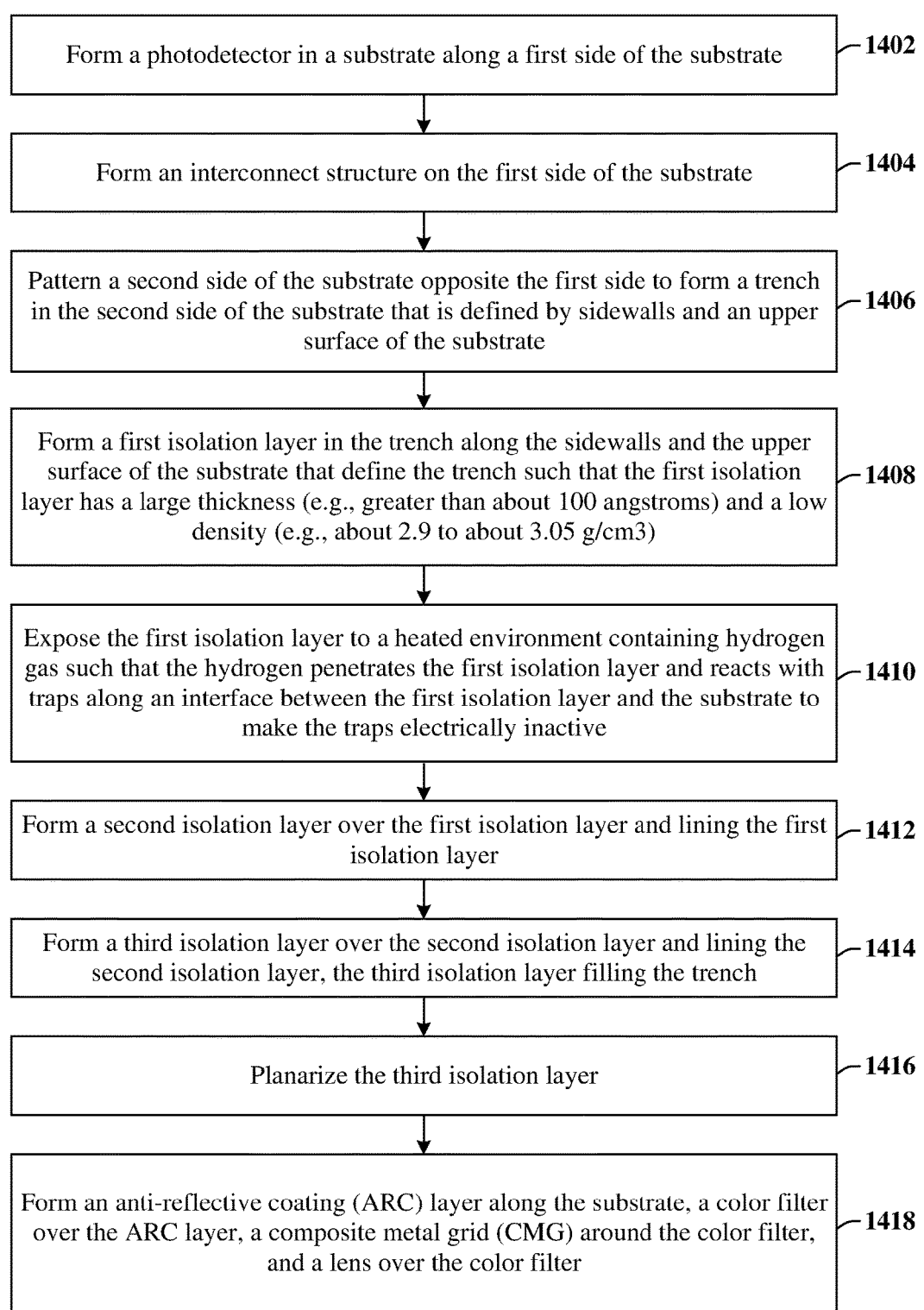

| | |
|---|---|
| Form a photodetector in a substrate along a first side of the substrate | 1402 |
| Form an interconnect structure on the first side of the substrate | 1404 |
| Pattern a second side of the substrate opposite the first side to form a trench in the second side of the substrate that is defined by sidewalls and an upper surface of the substrate | 1406 |
| Form a first isolation layer in the trench along the sidewalls and the upper surface of the substrate that define the trench such that the first isolation layer has a large thickness (e.g., greater than about 100 angstroms) and a low density (e.g., about 2.9 to about 3.05 g/cm3) | 1408 |
| Expose the first isolation layer to a heated environment containing hydrogen gas such that the hydrogen penetrates the first isolation layer and reacts with traps along an interface between the first isolation layer and the substrate to make the traps electrically inactive | 1410 |
| Form a second isolation layer over the first isolation layer and lining the first isolation layer | 1412 |
| Form a third isolation layer over the second isolation layer and lining the second isolation layer, the third isolation layer filling the trench | 1414 |
| Planarize the third isolation layer | 1416 |
| Form an anti-reflective coating (ARC) layer along the substrate, a color filter over the ARC layer, a composite metal grid (CMG) around the color filter, and a lens over the color filter | 1418 |

Fig. 14

ENHANCED TRENCH ISOLATION STRUCTURE

REFERENCE TO RELATED APPLICATION

This application is a Divisional of U.S. application Ser. No. 17/073,553, filed on Oct. 19, 2020, the contents of which are hereby incorporated by reference in their entirety.

BACKGROUND

Integrated circuits (ICs) with image sensors are used in a wide range of modern day electronic devices, such as, for example, cameras and cell phones. In recent years, complementary metal-oxide-semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 illustrates a flow diagram of some embodiments of a method for forming an image sensor comprising a trench isolation structure in which the trench isolation structure comprises a first isolation layer, a second isolation layer, and a third isolation layer.

DETAILED DESCRIPTION

Figure 1A:
FIG. 1A illustrates a cross-sectional view of some embodiments of an image sensor comprising a trench isolation structure in which the trench isolation structure comprises a first isolation layer, a second isolation layer, and a third isolation layer.
Figure 1A:
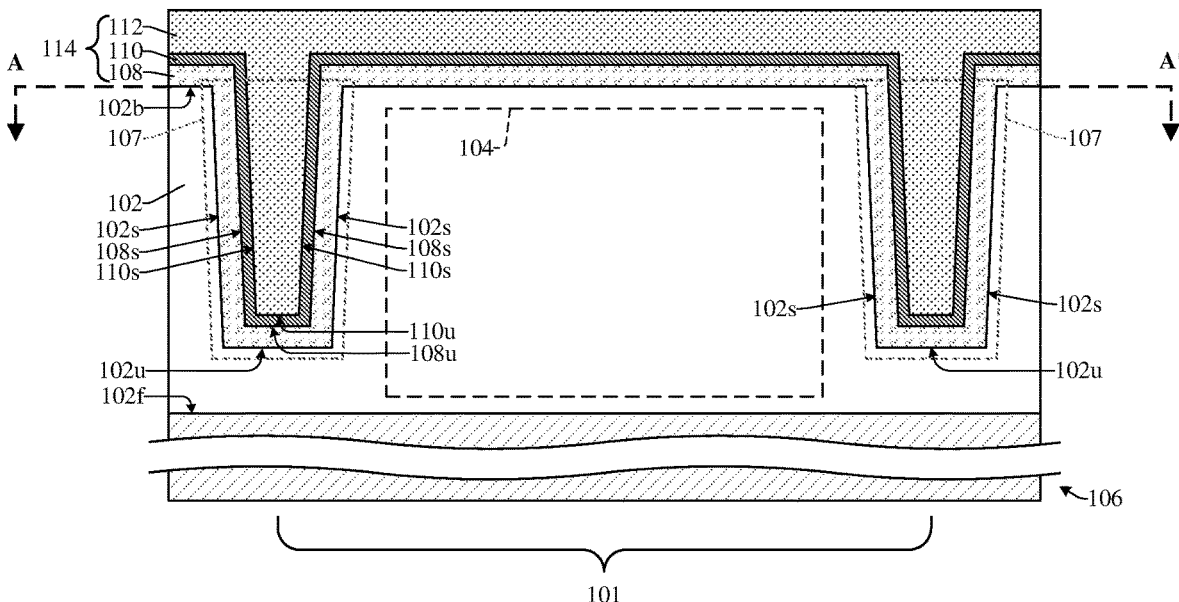

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor comprises a plurality of pixels along a substrate. A pixel comprises a photodetector in the substrate and a trench isolation structure surrounding the photodetector. The trench isolation structure may extend into the substrate from a back-side of the substrate to fill a trench in the substrate that is defined by sidewalls and an upper surface of the substrate. The trench isolation structure may electrically and/or optically isolate the pixel from neighboring pixels of the image sensor.

The trench isolation structure comprises one or more high-k dielectric layers and/or some other dielectric layer(s). For example, the trench isolation structure may comprise an aluminum oxide (e.g., $Al_2O_3$) layer lining the back-side of the substrate and lining the trench, a hafnium oxide (e.g., HfO) layer lining the aluminum oxide layer, a tantalum pentoxide (e.g., $Ta_2O_5$) layer lining the hafnium oxide layer, and a silicon dioxide (e.g., $SiO_2$) layer lining the tantalum pentoxide layer and filling the trench. The aluminum oxide layer and the hafnium oxide layer together may have a thickness of about 100 angstroms or some other suitable value. The high-k dielectric layers are configured to passivate the back-side of the substrate as well as the sidewalls and the upper surface of the substrate that define the trench.

For example, in some instances, undesired electrons may be generated in the substrate and/or along a surface of the substrate by an undesired leakage current or the like. These undesired electrons cause the photodetector to produce an abnormally high signal. The measure of this problem is often referred to as white pixel performance. However, the high-k dielectric layers of the trench isolation structure may be negatively charged which, in turn, may induce a positive charge in the substrate along an interface between the substrate and the high-k dielectric layers. The positive charge induced in the substrate may help reduce the undesirable effects of the electrons (e.g., the positive charge may counteract the negative charge of the electrons). Thus, the white pixel performance of the image sensor may be improved.

A flat band voltage of the image sensor and an interface trap density of the interface between the substrate and the high-k dielectric are both factors that affect white pixel performance. The flat band voltage is related to the amount of negative charge present along the interface between the substrate and the high-k dielectric (e.g., the amount of negative charge within the high-k dielectric). A higher flat band voltage may correspond to a better white pixel performance. Further, interface traps can store charges which can adversely affect white pixel performance. Thus, reducing the interface trap density may further improve a white pixel performance of the image sensor.

A challenge with the image sensor is that the high-k dielectric layers may not provide sufficient passivation for the back-side of the substrate. For example, the aluminum oxide layer and the hafnium oxide layer together may not provide enough negative charge to sufficiently passivate the substrate (e.g., a flat band voltage may be lower than desired and/or an interface trap density may be higher than desired). As a result, a white pixel performance of the image sensor may be worse than desired.

Various embodiments of the present disclosure are related to an image sensor comprising substrate and a trench isolation structure for improving a passivation of the substrate and a performance of the image sensor. For example, an image sensor comprises a substrate and a photodetector in the substrate. Sidewalls and an upper surface of the substrate define a trench in the substrate. A trench isolation structure extends along a back-side of the substrate and fills the trench. The trench isolation structure laterally surrounds the photodetector. The trench isolation structure comprises a first isolation layer that extends along the sidewalls and the upper surface of the substrate that define the trench. The trench isolation structure further comprises a second isolation layer over the first isolation layer. The second isolation layer lines the first isolation layer. The trench isolation structure further comprises a third isolation layer over the second isolation layer. The third isolation layer lines the second isolation layer. Hydrogen (e.g., $H_2$) atoms are arranged along an interface between the substrate and the first isolation layer. Further, the first isolation layer is negatively charged, and a thickness of the first isolation layer is large.

By including the first isolation layer in the trench isolation structure, a passivation of the substrate may be improved. For example, because the first isolation layer is negatively charged, and because the thickness of the first isolation layer is large, a total negative charge of the first isolation layer may be high. In turn, a large positive charge may be induced in the substrate and/or along the back-side of the substrate. Thus, a flat band voltage of the image sensor may be high. As a result, undesired electrons generated in and/or along the substrate may be reduced, thereby improving a white pixel performance of the image sensor.

In some embodiments, the first isolation layer consists of aluminum oxide and has a thickness of about 100 angstroms or more. Further, in some embodiments, the trench isolation structure is devoid of hafnium oxide. Because aluminum oxide has a more negative fixed charge density than does hafnium oxide, the overall effective charge of the trench isolation structure may be more negative by omitting hafnium oxide from the trench isolation structure. As a result, a white pixel performance of the image sensor may be improved.

Further, by including the hydrogen atoms along the interface, an interface trap density may be reduced. For example, the hydrogen atoms may take the places of a number of the interface traps, thereby reducing the interface trap density. As a result, a white pixel performance of the image sensor may be further improved.

Figure 1B:
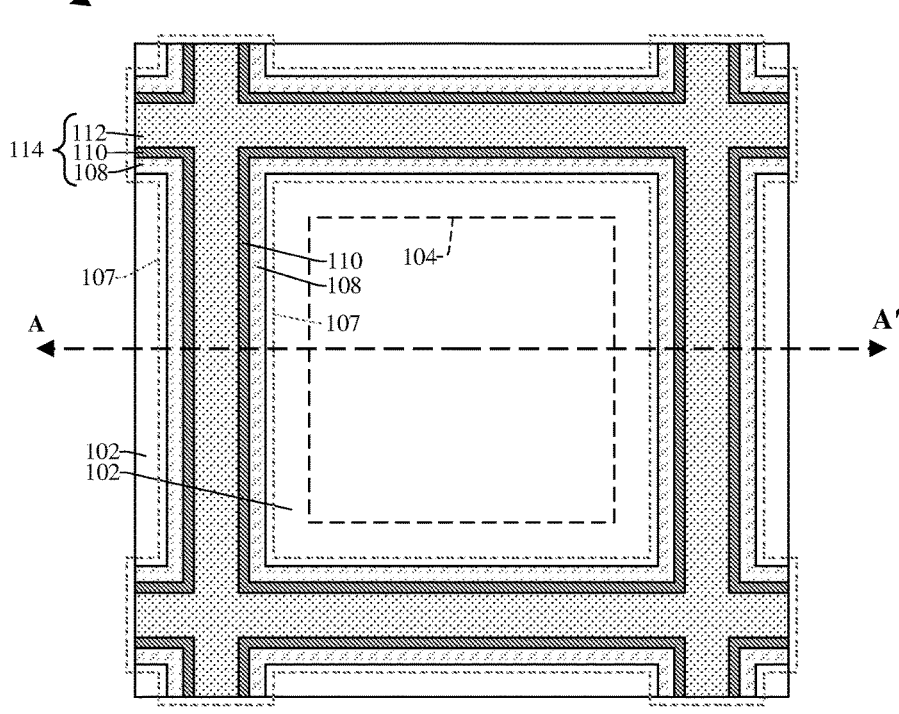
FIG. 1B illustrates a top view of some embodiments of the image sensor of FIG. 1A.

Referring to FIGS. 1A and 1B simultaneously, FIG. 1A illustrates a cross-sectional view 100 of some embodiments of an image sensor comprising a trench isolation structure 114 in which the trench isolation structure 114 comprises a first isolation layer 108, a second isolation layer 110, and a third isolation layer 112, and FIG. 1B illustrates a top view 150 of some embodiments of the image sensor of FIG. 1A. The cross-sectional view 100 of FIG. 1A may, for example, be taken across line A-A' of FIG. 1B.

The image sensor comprises a pixel 101 along a substrate 102. A photodetector 104 is in the substrate 102 along a front-side 102f of the substrate 102. An interconnect structure 106 extends along the front-side 102f of the substrate 102. Further, sidewalls 102s of the substrate 102 and an upper surface 102u of the substrate 102 define a trench 107 in the substrate 102.

The trench isolation structure 114 extends along a back-side 102b of the substrate 102 and fills the trench 107. The trench isolation structure 114 laterally surrounds the photodetector 104. Further, the trench isolation structure 114 may electrically and/or optically isolate the pixel 101 from neighboring pixels (not shown) of the image sensor.

The first isolation layer 108 extends along the back-side 102b of the substrate 102. The first isolation layer 108 also extends into the trench 107. The first isolation layer 108 fills a first portion of the trench 107. In some embodiments, the first isolation layer 108 is on the sidewalls 102s and the upper surface 102u of the substrate 102 that define the trench 107 (e.g., the first isolation layer 108 lines the trench 107). In some embodiments, the first isolation layer 108 is in direct contact with the sidewalls 102s, the upper surface 102u, and the back-side 102b of the substrate 102. The first isolation layer 108 comprises a first dielectric material.

The second isolation layer 110 is on, and extends along, the first isolation layer 108. The second isolation layer 110 also extends along the back-side 102b of the substrate 102 and into the trench 107. The second isolation layer 110 fills a second portion of the trench 107. The second isolation layer 110 is on sidewalls 108s and an upper surface 108u of the first isolation layer 108 (e.g., the second isolation layer 110 lines the first isolation layer 108). In some embodiments, the second isolation layer 110 is in direct contact with the first isolation layer 108 along the sidewalls 108s and the upper surface 108u of the first isolation layer 108. The second isolation layer 110 comprises a second dielectric material different from the first dielectric material.

The third isolation layer 112 is on, and extends along, the second isolation layer 110. The third isolation layer 112 also extends along the back-side 102b of the substrate 102 and into the trench 107. The third isolation layer 112 fills a third portion of the trench 107 (e.g., a remainder of the trench 107). The third isolation layer 112 is on sidewalls 110s and an upper surface 110u of the second isolation layer 110 (e.g., the third isolation layer 112 lines the second isolation layer 110). In some embodiments, the third isolation layer 112 is in direct contact with the second isolation layer 110 along the sidewalls 110s and the upper surface 110u of the second isolation layer 110. The third isolation layer 112 comprises a third material different from the first dielectric material and different from the second dielectric material.

In some embodiments, the first dielectric material may, for example, be or comprise aluminum oxide (e.g., $Al_2O_3$) or some other suitable material. Further, in some embodiments, the first dielectric material may also comprise hydrogen (e.g., $H_2$) due to the hydrogen getting trapped within the aluminum oxide during and/or after an alloy process (see, for example, FIG. 9).

A thickness of the first isolation layer 108 may, for example, be about 100 angstroms, greater than 100 angstroms, or some other suitable thickness. For example, the thickness of the first isolation layer 108 may be about 120 angstroms, about 140 angstroms, or some other value. The large thickness of the first isolation layer provides for the first isolation layer 108 to have greater negative charge. Thus, a flat band voltage may be increased. As a result, a white pixel performance of the image sensor may be improved.

Further, a density of the first isolation layer 108 may be low. For example, the density of the first isolation layer 108 may be less than about 3.17 g/cm³, less than about 3.05 g/cm³, may be about 2.9 g/cm³ to about 3.05 g/cm³, or some other suitable value. The low density of the first isolation layer 108 may result in enhanced hydrogen penetration during the alloy process (see, for example, FIG. 9). As a result, hydrogen atoms (not shown) are arranged along an interface between the substrate 102 and the first isolation layer 108. The hydrogen atoms may take the place of traps along the interface between the substrate 102 and the first isolation layer 108. Thus, the hydrogen atoms may reduce a trap density of the interface. In turn, a white pixel performance of the image sensor may be further improved.

In short, by including the first isolation layer 108 in the image sensor along the back-side 102b of the substrate 102 and in the trench 107, a passivation of the substrate 102 and a white pixel performance of the image sensor may be improved.

In some embodiments, the second dielectric material may, for example, be or comprise tantalum pentoxide (e.g., $Ta_2O_5$) or some other suitable material. In some embodiments, the third material may, for example, be or comprise silicon dioxide (e.g., $SiO_2$) or some other suitable value.

In some embodiments, the trench isolation structure 114 is devoid of hafnium oxide (e.g., HfO). As a result, the net charge of the trench isolation structure 114 may be more negative and thus a passivation of the substrate 102 and/or a white pixel performance of the image sensor may be improved.

In some embodiments, a thickness of the second isolation layer 110 may, for example, be about 400 to about 600 angstroms or some other suitable value. In some embodiments, a ratio of the thickness of the first isolation layer 108 to the thickness of the second isolation layer 110 may be about 0.17 to about 0.38 or some other suitable value. In some embodiments, a density of the second isolation layer 110 may, for example, be about 8.2 g/cm³ or some other suitable value. In some embodiments, a ratio of the density of the first isolation layer to the density of the second isolation layer 110 may be about 0.35 to about 0.37 or some other suitable value.

In some embodiments, the substrate 102 may, for example, comprise silicon, some III-V material, some other semiconductor material, or the like.

In some embodiments, the photodetector 104 may, for example, be or comprise a photodiode, an avalanche photodiode, a single-photon avalanche diode, some other suitable photodetector, or the like.

In some embodiments, the interconnect structure 106 may, for example, comprise one or more dielectric layers, one or more etch-stop layers, one or more contacts, one or more metal wires, one or more metal vias, one or more solder bumps, one or more bond pads, or some other suitable features. Further, the interconnect structure 106 may be electrically connected to the photodetector 104.

Figure 2:
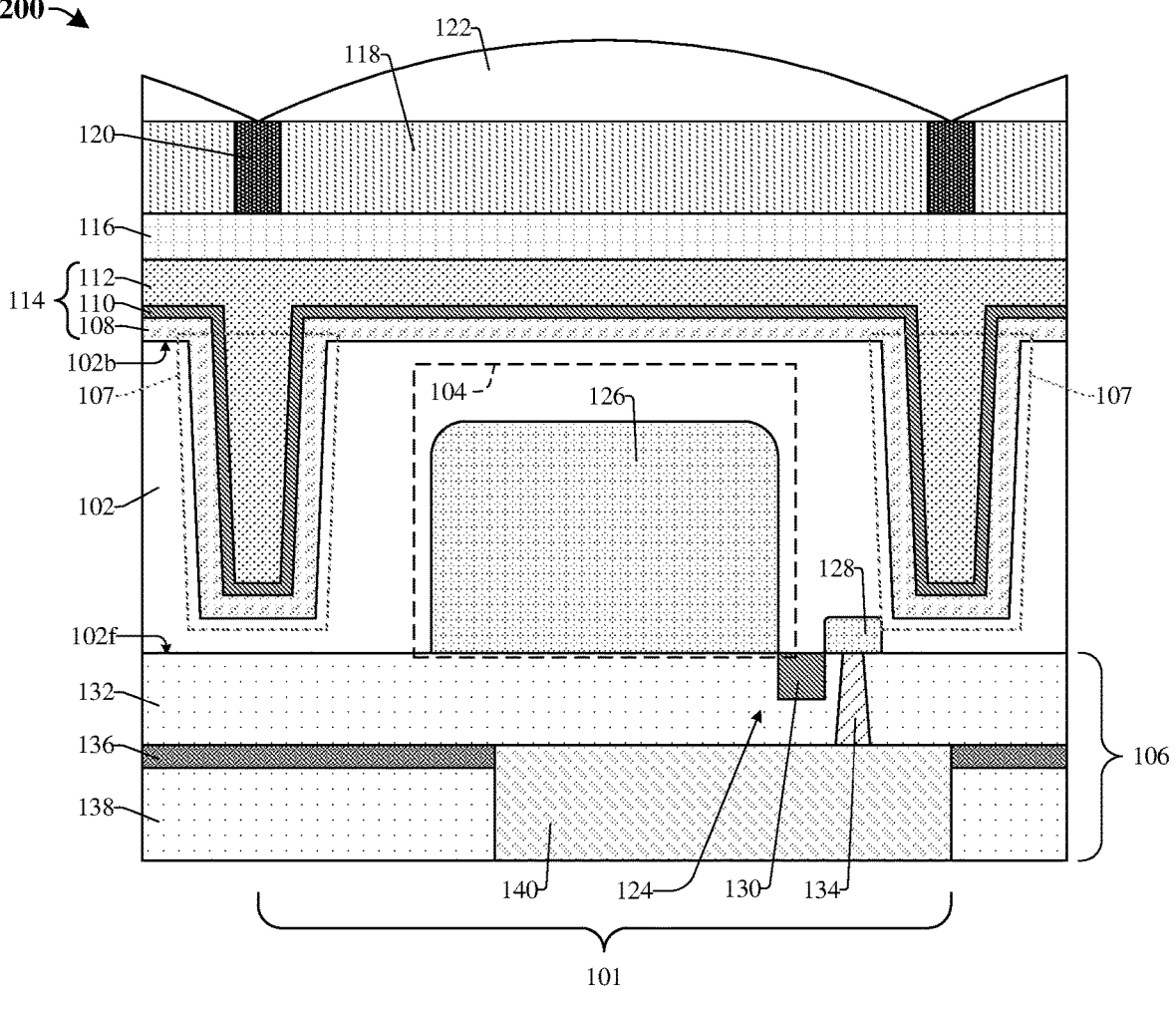
FIG. 2 illustrates a cross-sectional view of some additional embodiments of an image sensor comprising a trench isolation structure.

FIG. 2 illustrates a cross-sectional view 200 of some additional embodiments of an image sensor comprising a trench isolation structure 114.

In such embodiments, the photodetector 104 may, for example, comprise a transfer transistor 124. In some embodiments, the photodetector 104 comprises a photodiode semiconductor region 126, a floating diffusion semiconductor region 128, and a transfer gate 130. Other suitable features are also feasible. In some embodiments, the photodiode semiconductor region 126 forms a p-n junction with the substrate 102.

Further, in such embodiments, the interconnect structure 106 may, for example, comprise a first dielectric layer 132 along the front-side 102f of the substrate 102, an etch-stop layer 136 along the first dielectric layer 132, a second dielectric layer 138 along the etch-stop layer 136, a contact 134 extending through the first dielectric layer 132 to the transfer transistor 124, and a metal wire 140 extending through the second dielectric layer and the etch-stop layer to the contact 134. Other suitable features are also feasible.

Furthermore, in such embodiments, an anti-reflective coating (ARC) layer 116 is over the back-side 102b of the substrate 102, a color filter 118 is over the ARC layer 116, a composite metal grid (CMG) 120 laterally surrounds the color filter 118, and a lens 122 is over the color filter 118. Radiation (e.g., photons) may enter the image sensor through the lens 122. Thus, the image sensor may be back-side illuminated.

Although the image sensor illustrated in FIG. 2 is back-side illuminated, it will be appreciated that in some other embodiments (not shown), the ARC layer 116, the color filter 118, the CMG 120, and the lens 122 may be along the front-side 102f of the substrate 102 and the image sensor may alternatively be front-side illuminated.

Figure 3:
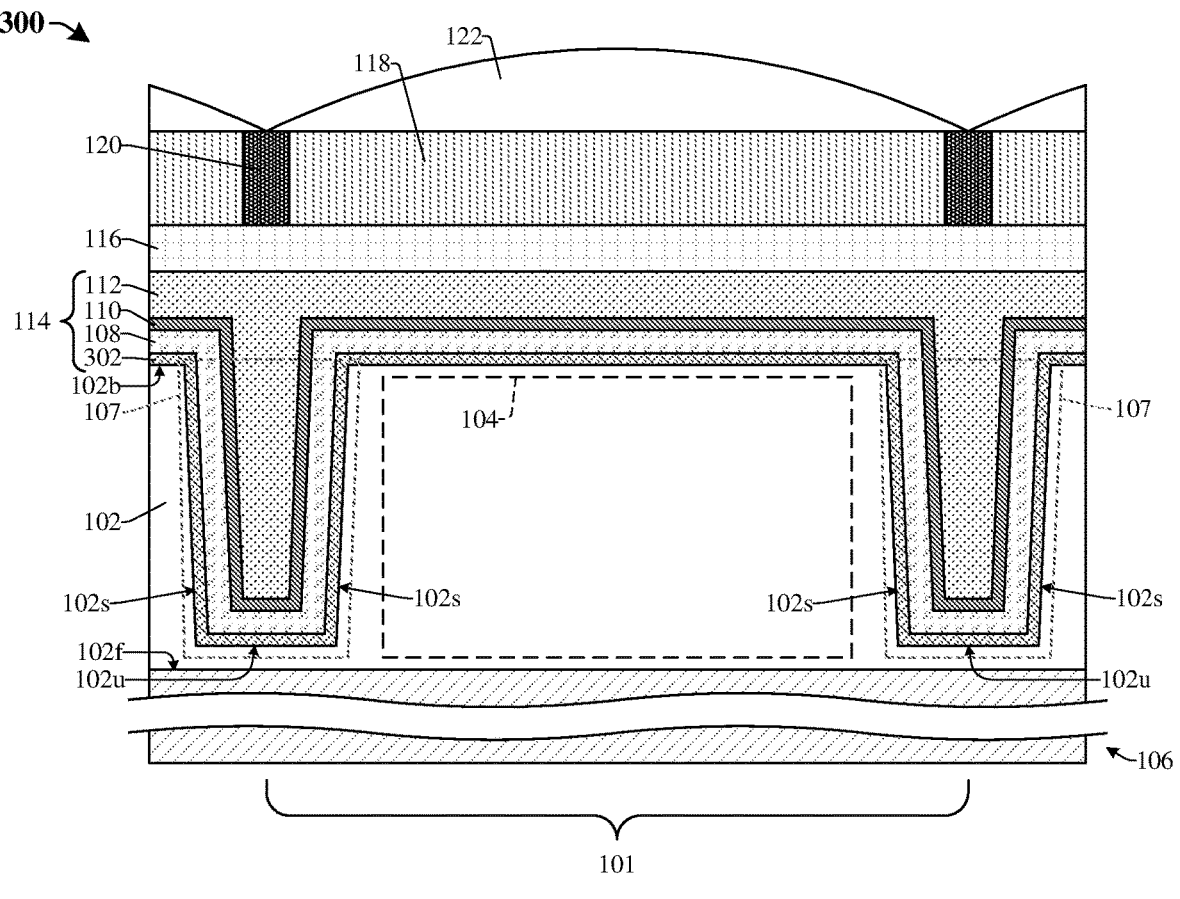
FIG. 3 illustrates a cross-sectional view of some embodiments of an image sensor comprising a trench isolation structure in which the trench isolation structure further comprises an interlayer dielectric layer.

FIG. 3 illustrates a cross-sectional view 300 of some embodiments of an image sensor comprising a trench isolation structure 114 in which the trench isolation structure 114 further comprises an interlayer dielectric layer 302.

In such embodiments, the interlayer dielectric layer 302 is on, and extends along, the back-side 102b of the substrate 102. The interlayer dielectric layer 302 also extends into the trench 107 and may fill a portion of the trench 107. The interlayer dielectric layer 302 is on the sidewalls 102s and the upper surface 102u of the substrate 102 that define the trench 107 (e.g., the interlayer dielectric layer 302 lines the trench 107). Further, the interlayer dielectric layer 302 may separate the first isolation layer 108 from the substrate 102.

In addition, in such embodiments, the first isolation layer 108 is on, and extends along, the interlayer dielectric layer 302 (e.g., the first isolation layer 108 lines the interlayer dielectric layer 302). In some embodiments, the first isolation layer 108 is on sidewalls and an upper surface of the interlayer dielectric layer 302. In some embodiments, the interlayer dielectric layer 302 may be in direct contact with the substrate 102 and the first isolation layer 108.

In some embodiments, the interlayer dielectric layer 302 may, for example, be a native oxide layer that may be formed naturally while forming the first isolation layer 108 in the trench 107. In some embodiments, the interlayer dielectric layer 302 may, for example, be or comprise silicon dioxide (e.g., $SiO_2$) or the like.

In some embodiments, a thickness of the interlayer dielectric layer 302 may be small. For example, a thickness of the interlayer dielectric layer 302 may, for example, be less than about angstroms, less than about 15 angstroms, or some other suitable value. In some embodiments, a ratio of the thickness of the interlayer dielectric layer 302 to the first thickness of the first isolation layer 108 may, for example, be less than about 0.2, less than about 0.15, or some other suitable value.

FIGS. 4-13 illustrate cross-sectional views 400-1300 of some embodiments of a method for forming an image sensor comprising a trench isolation structure 114 in which the trench isolation structure 114 comprises a first isolation layer 108, a second isolation layer 110, and a third isolation layer 112. Although FIGS. 4-13 are described in relation to a method, it will be appreciated that the structures disclosed in FIGS. 4-13 are not limited to such a method, but instead may stand alone as structures independent of the method.

Figure 4:
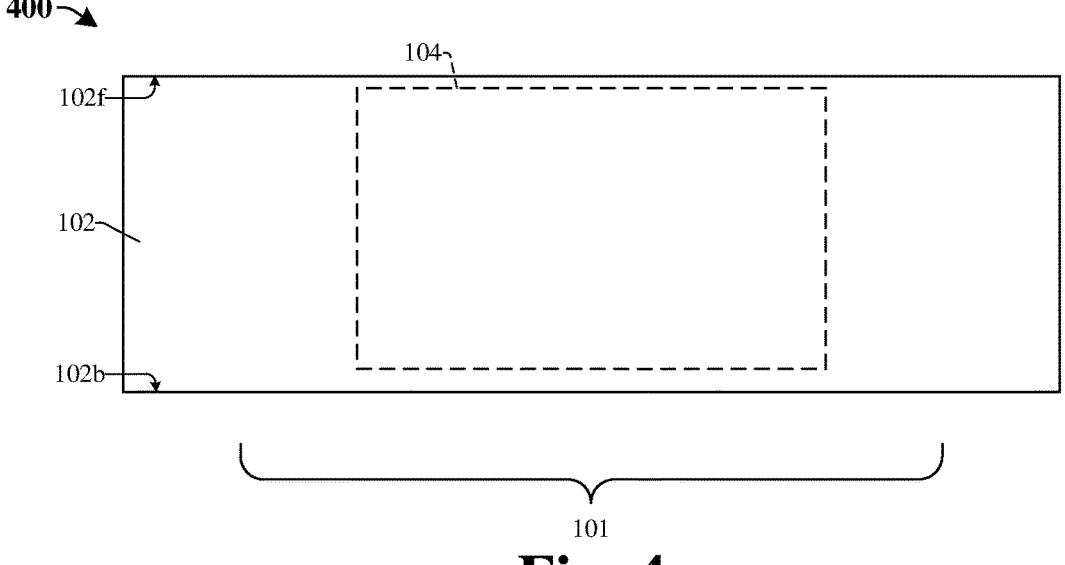
FIGS. 4-13 illustrate cross-sectional views of some embodiments of a method for forming an image sensor comprising a trench isolation structure in which the trench isolation structure comprises a first isolation layer, a second isolation layer, and a third isolation layer.

As shown in cross-sectional view 400 of FIG. 4, a photodetector 104 is formed in a substrate 102 along a front-side 102$f$ of the substrate 102. The photodetector 104 may, for example, be formed by any of one or more ion implantation processes, one or more diffusion processes, one or more deposition processes, one or more patterning processes, or some other suitable process(es).

Figure 5:
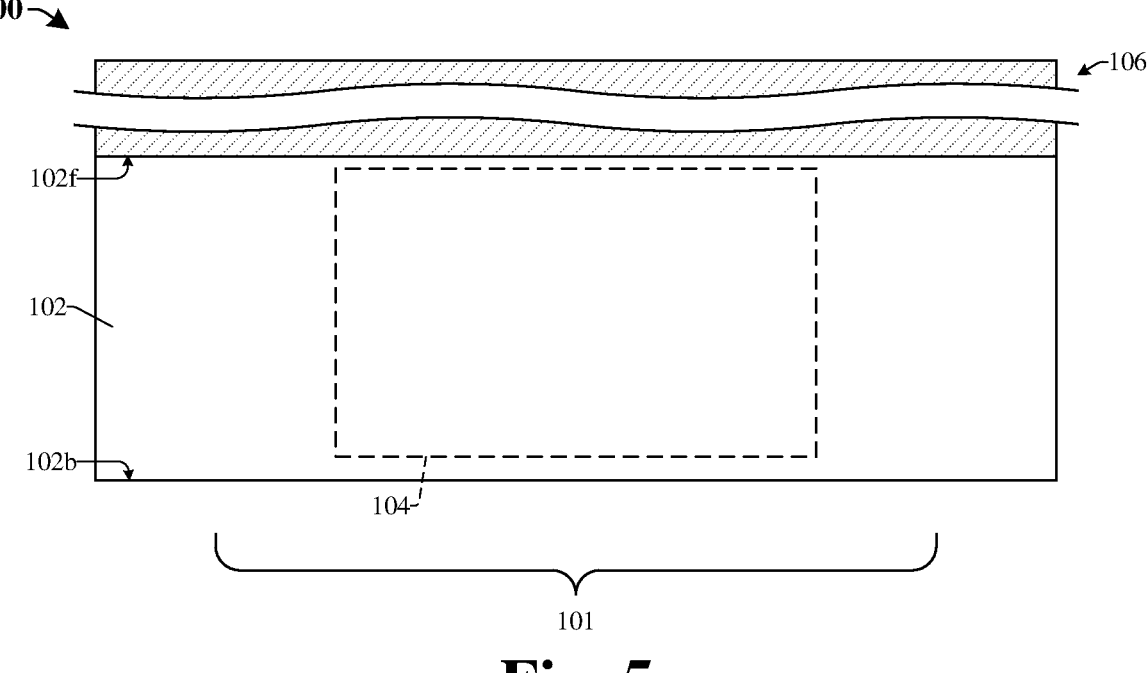

As shown in cross-sectional view 500 of FIG. 5, an interconnect structure 106 is formed over the substrate 102 along the front-side 102$f$ of the substrate 102. The interconnect structure 106 may, for example, be formed by any of one or more deposition processes, one or more patterning processes, one or more planarization processes, or some other suitable process(es).

For example, the interconnect structure 106 may be formed by forming a dielectric layer (e.g., 132 of FIG. 2) over the substrate 102 along the front-side 102$f$ of the substrate 102, patterning the dielectric layer to form a contact opening in the dielectric layer, forming a contact (e.g., 134 of FIG. 2) in the contact opening, forming an etch-stop layer (e.g., 136 of FIG. 2) over the first dielectric layer, forming a second dielectric layer (e.g., 138 of FIG. 2) over the etch-stop layer, patterning the second dielectric layer and the etch-stop layer to form a wire opening in the second dielectric layer and the etch-stop layer, and forming a metal wire (e.g., 140 of FIG. 2) in the wire opening.

Figure 6:
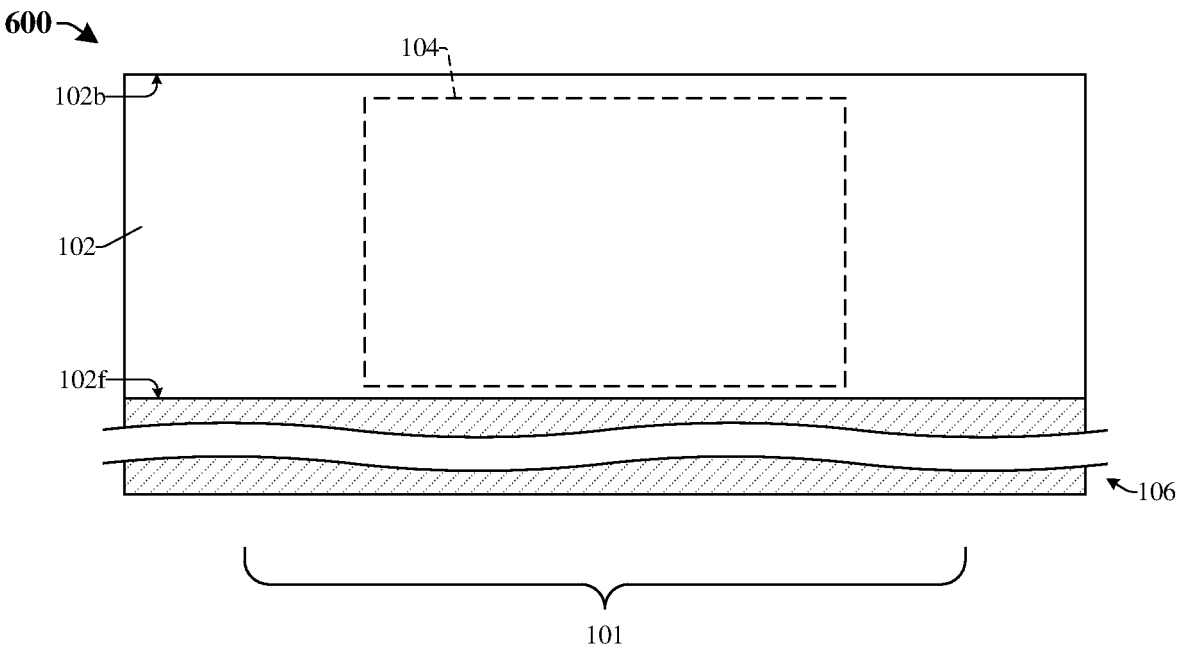

As shown in cross-sectional view 600 of FIG. 6, the substrate 102 may be rotated such that the back-side 102$b$ of the substrate 102 is over the front-side 102$f$ of the substrate 102.

Figure 7:
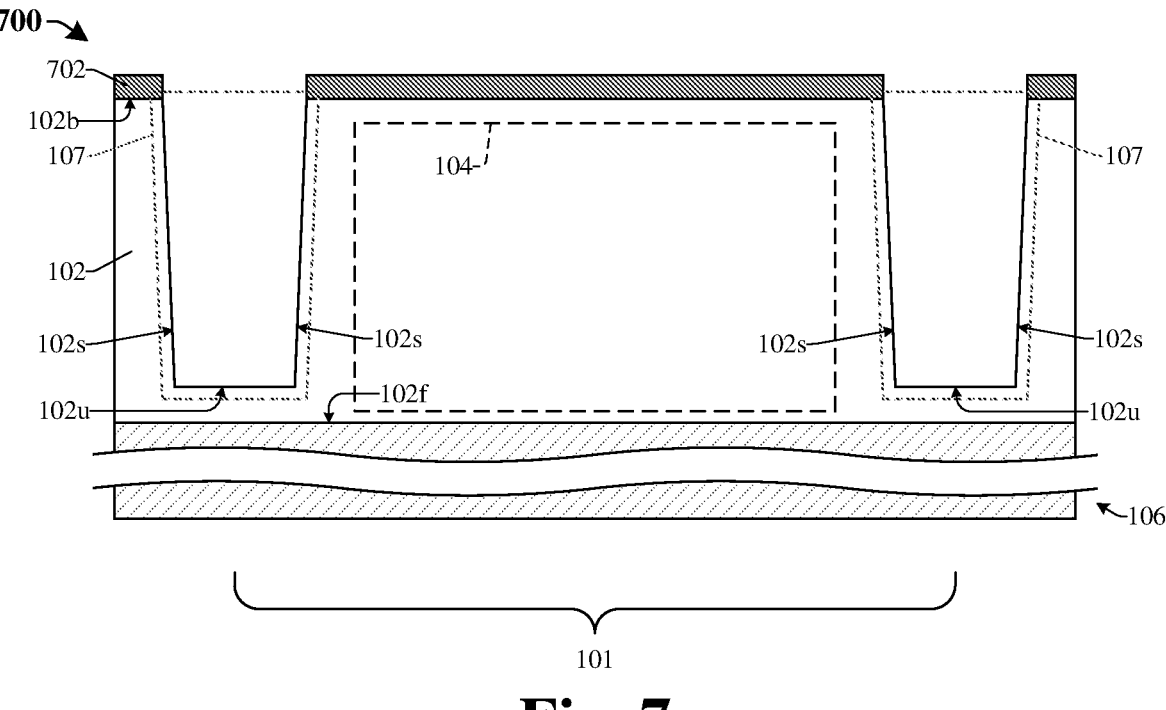

As shown in cross-sectional view 700 of FIG. 7, a mask 702 is formed on the back-side 102$b$ of the substrate 102 and the back-side of the substrate 102 is patterned according to the mask 702 to form a trench 107 in the substrate 102. The trench 107 is defined by sidewalls 102$s$ and an upper surface 102$u$ of the substrate 102. Further, the trench 107 laterally surrounds the photodetector 104.

In some embodiments, the mask 702 may, for example, be or comprise photoresist, some metal-oxide, some metal-nitride, or some other suitable material. In some embodiments, the mask 702 may be removed after the patterning.

In some embodiments, the patterning may, for example, comprise a dry etching process or some other suitable process. For example, the patterning may comprise a reactive ion etching (RIE) process, an ion beam etching (IBE) process, a remote plasma process, or some other suitable process.

Figure 8:
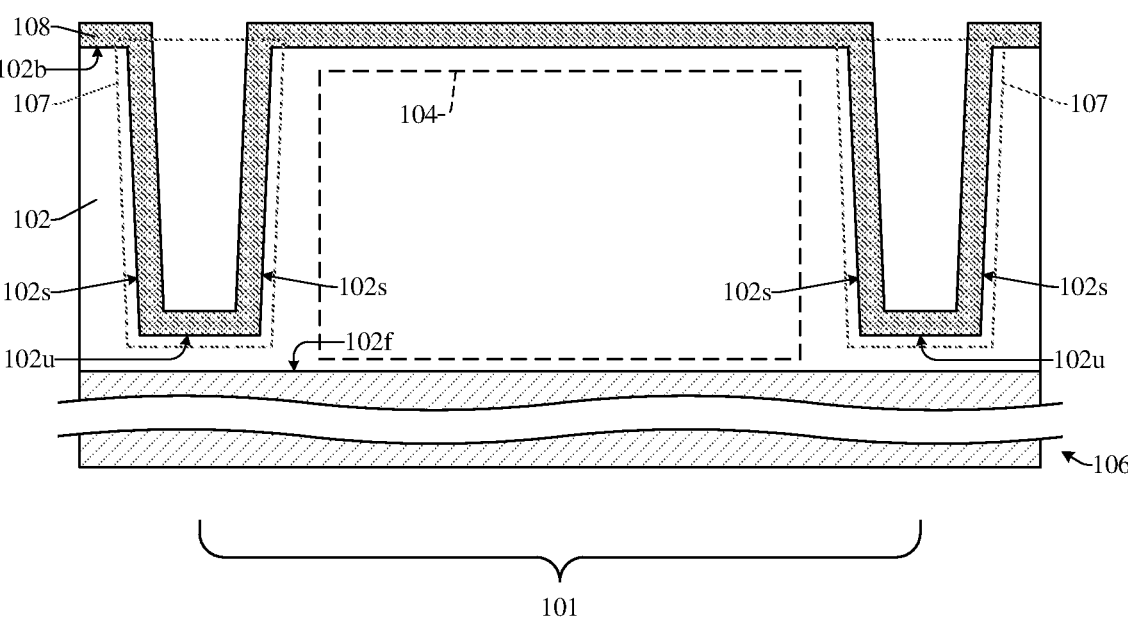

As shown in cross-sectional view 800 of FIG. 8, a first isolation layer 108 is formed along the back-side 102$b$ of the substrate 102 and in the trench 107 along the sidewalls 102$s$ and the upper surface 102$u$ of the substrate 102 that define the trench 107. The first isolation layer 108 lines the substrate 102 and fills a first portion of the trench 107.

The first isolation layer 108 may, for example, be formed by depositing aluminum oxide (e.g., $Al_2O_3$) or some other suitable material over the substrate 102 by any of a chemical vapor deposition (CVD) process, a physical vapor deposition (PVD) process, an atomic layer deposition (ALD) process, a spin on process, or some other suitable process.

In some embodiments, a temperature during the first isolation layer 108 deposition is low. For example, in some embodiments, the temperature may be less than about 210 degrees Celsius, between about 170 degrees Celsius to about 210 degrees Celsius, or some other suitable value. The low temperature during the deposition may reduce a density of the first isolation layer 108. Further, in some embodiments, an $O_3$ concentration of the first isolation layer 108 may be low. For example, in some embodiments, the $O_3$ concentration is less than about 200 grams/m$^3$, is about 100 grams/m$^3$, is between about 100 grams/m$^3$ to about 200 grams/m$^3$, or is some other suitable value. The low $O_3$ concentration may further reduce the density of the first isolation layer 108.

In some embodiments, an interlayer dielectric layer (e.g., 302 of FIG. 3) may form on the substrate 102 between the first isolation layer 108 and the substrate 102 during the formation of the first isolation layer 108. The interlayer dielectric layer may be or comprise silicon dioxide (e.g., $SiO_2$) or the like. The interlayer dielectric layer may form naturally during the deposition. For example, surfaces of the substrate 102 may experience oxidation during the deposition and thus a layer of silicon dioxide may be formed on the surfaces of the substrate 102. However, due to the low deposition temperature and the low $O_3$ concentration, a thickness of the interlayer dielectric layer may be small. For example, the thickness may be less than about 20 angstroms, less than about 15 angstroms, or some other suitable value. Compared to some other deposition process(es), a thickness of the interlayer dielectric layer may be reduced by about 30 to 50 percent or some other value.

Because the thickness of the interlayer dielectric layer is reduced, a passivation of the substrate 102 may be improved. For example, a distance between the first isolation layer 108 and the substrate 102 may be reduced. In turn, the negative charge of the first isolation layer 108 may be closer to the substrate 102 and hence may induce a greater positive charge in and/or along the substrate 102. As a result, a flat band voltage may be increased and a white pixel performance may be improved.

Figure 9:
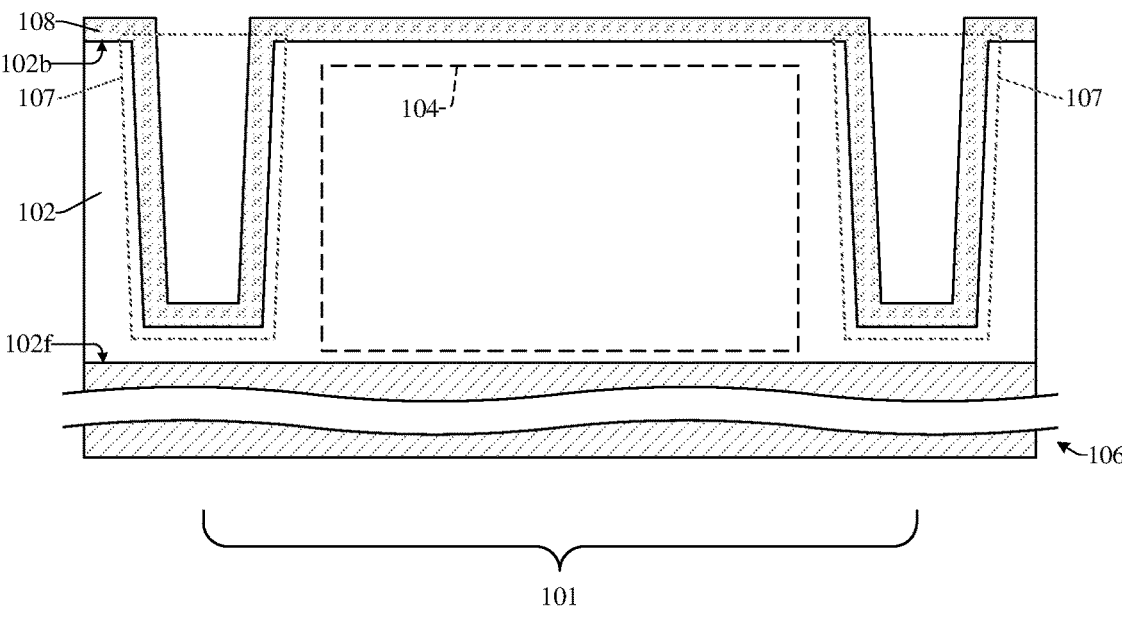

As shown in cross-sectional view 900 of FIG. 9, the first isolation layer 108 is exposed to a heated environment containing hydrogen gas (e.g., $H_2$) to alloy the first isolation layer 108 with the hydrogen. During the alloy process, the hydrogen gas may penetrate the first isolation layer 108 and may fill traps along the interface between the substrate 102 and the first isolation layer 108. Thus, the hydrogen allow process may reduce a trap density at the interface. In some embodiments, some hydrogen may remain within the first isolation layer 108. In some embodiments, the temperature of the heated environment during the alloy may, for example, be about 300 to 400 degrees Celsius or some other suitable temperature.

Because of the low density of the first isolation layer 108, the hydrogen gas may more easily penetrate the first isolation layer 108 during the alloy process. As a result, more hydrogen atoms may reach the interface and fill traps along the interface, thereby reducing an interface trap density of the interface between the substrate 102 and the first isolation layer 108. Thus, a passivation of the back-side 102$b$ of the substrate 102 and a white pixel performance of the image sensor may be improved.

It should be noted that to illustrate the alloy process, the hatching of the first isolation layer 108 is changed in FIG. 9.

Figure 10:
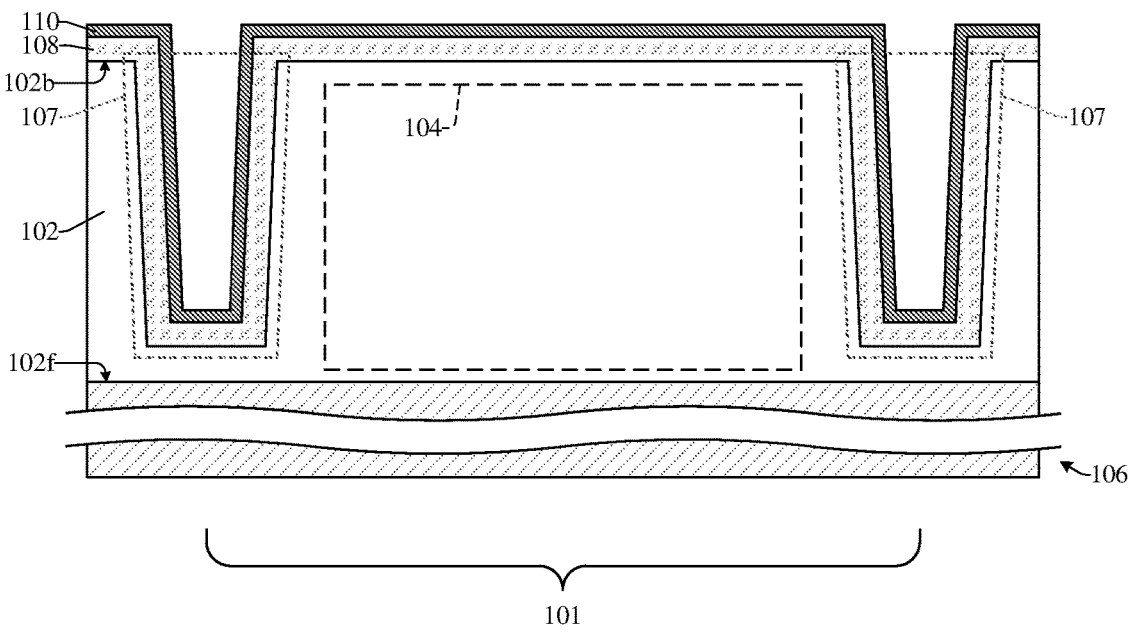

As shown in cross-sectional view 1000 of FIG. 10, a second isolation layer 110 is conformally formed over the first isolation layer 108. The second isolation layer 110 lines the first isolation layer 108 and fills a second portion of the trench 107.

The second isolation layer 110 may, for example, be formed by depositing tantalum oxide (e.g., $Ta_2O_5$) or some other suitable material over the substrate 102 by any of a CVD process, a PVD process, an ALD process, a spin on process, or some other suitable process. In some embodiments, a temperature during the second isolation layer 110 deposition may, for example, be greater than the temperature during the first isolation layer 108 deposition.

Figure 11:
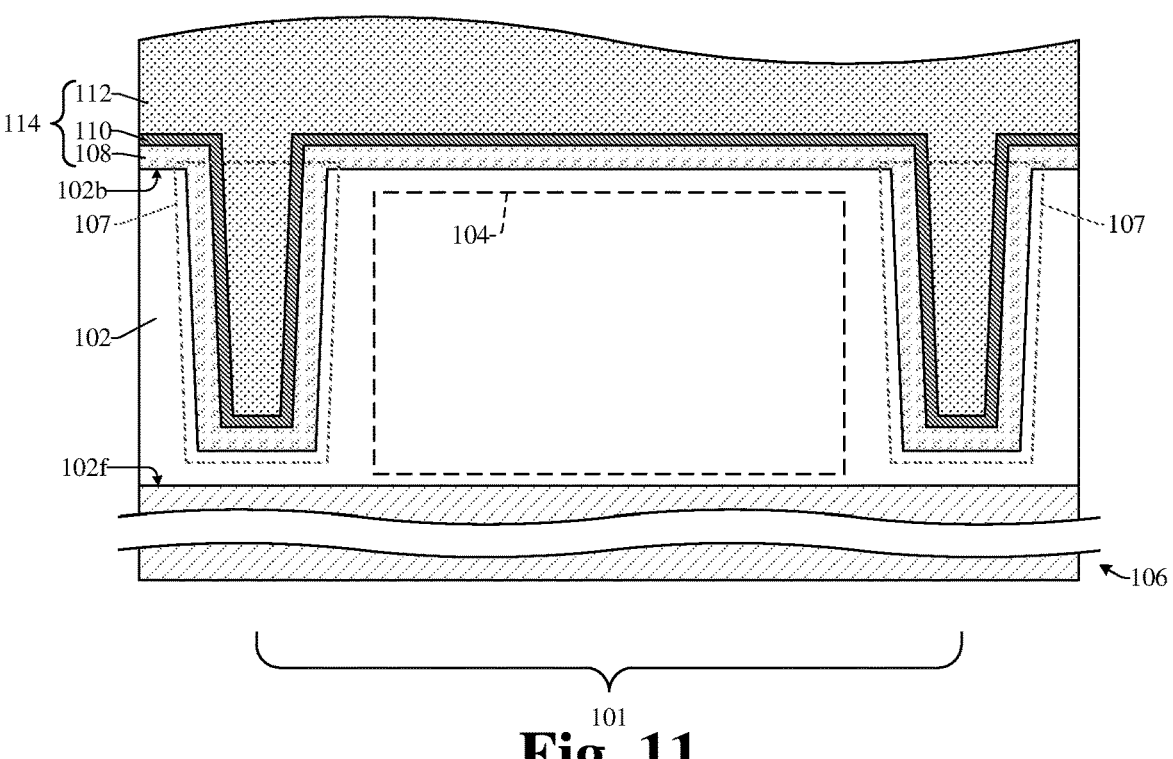

As shown in cross-sectional view 1100 of FIG. 11, a third isolation layer 112 is conformally formed over the second isolation layer 110. The third isolation layer 112 lines the second isolation layer 110 and fills a remainder of the trench 107. The first isolation layer 108, the second isolation layer 110, and the third isolation layer 112 together define a trench isolation structure 114. In some embodiments, the interlayer dielectric layer (not shown) further defines the trench isolation structure 114.

The third isolation layer 112 may, for example, be formed by depositing silicon dioxide (e.g., $SiO_2$) or some other suitable material over the substrate 102 by any of a CVD process, a PVD process, an ALD process, a spin on process, or some other suitable process.

In some embodiments, hafnium oxide is not deposited over the substrate 102 as part of the trench isolation structure 114 formation process (e.g., the trench isolation structure 114 is devoid of hafnium oxide). For example, in some embodiments, hafnium oxide is not deposited during, nor between, the formation of the first isolation layer 108, the second isolation layer 110, and the third isolation layer 112. As a result, the net charge of the trench isolation structure 114 may be more negative and thus a passivation of the substrate 102 and/or a white pixel performance of the image sensor may be improved.

Figure 12:
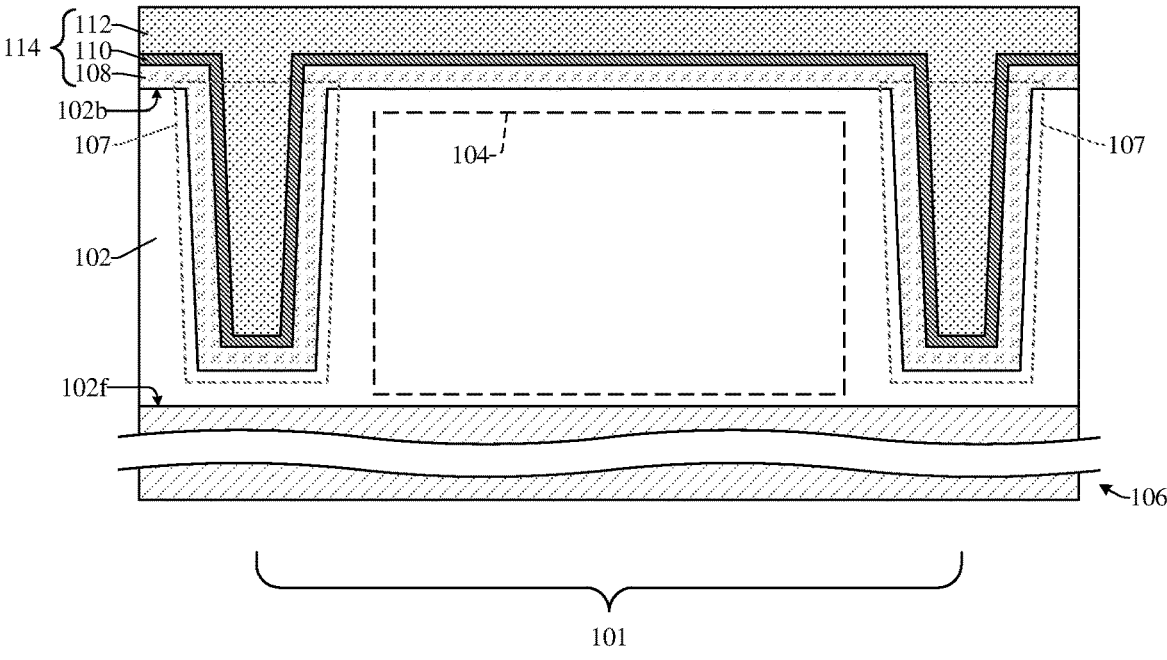

As shown in cross-sectional view 1200 of FIG. 12, a planarization process is performed on the third isolation layer 112 to thin the third isolation layer 112 and/or to planarize a top surface of the third isolation layer 112. The planarization process may, for example, be or comprise a chemical mechanical planarization (CMP) process or some other suitable planarization process.

Figure 13:
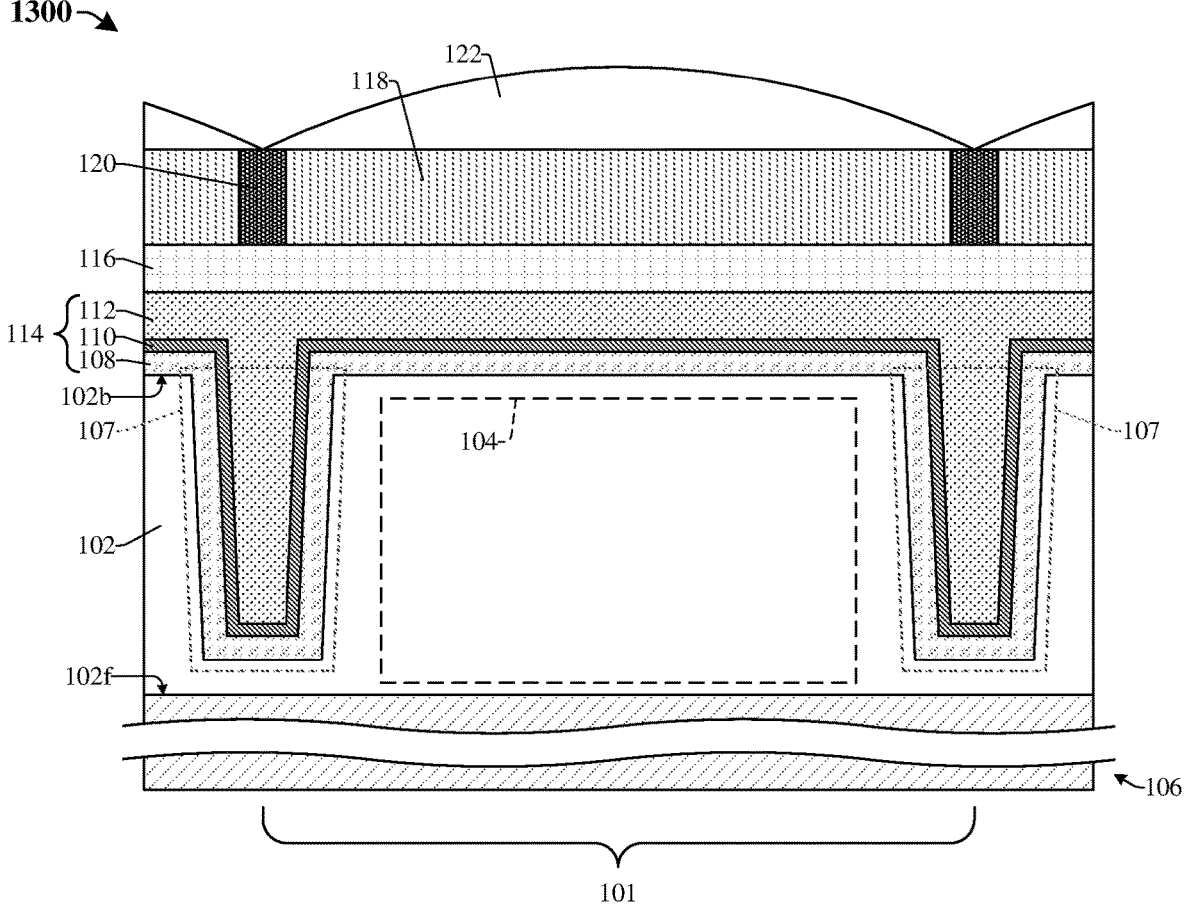

As shown in cross-sectional view 1300 of FIG. 13, an ARC layer 116 is formed over the third isolation layer 112, a color filter 118 is formed over the ARC layer 116, a CMG 120 is formed adjacent to the color filter 118 to surround the color filter 118, and a lens 122 is formed over the color filter 118.

Although FIG. 13 illustrates the ARC layer 116, the color filter 118, the CMG 120, and the lens 122 being formed along the back-side 102*b* of the substrate 102, it will be appreciated that in some alternative embodiments, the ARC layer 116, the color filter 118, the CMG 120, and the lens 122 may alternatively be formed along the front-side 102*f* of the substrate 102 and image sensor may alternatively be front-side illuminated.

FIG. 14 illustrates a flow diagram of some embodiments of a method 1400 for forming an image sensor comprising a trench isolation structure in which the trench isolation structure comprises a first isolation layer, a second isolation layer, and a third isolation layer. While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a photodetector is formed in a substrate along a first side of the substrate. FIG. 4 illustrates a cross-sectional view 400 of some embodiments corresponding to act 1402.

At 1404, an interconnect structure is formed on the first side of the substrate. FIG. 5 illustrates a cross-sectional view 500 of some embodiments corresponding to act 1404.

At 1406, a second side of the substrate opposite the first side is patterned to form a trench in the second side of the substrate that is defined by sidewalls and an upper surface of the substrate. FIG. 7 illustrates a cross-sectional view 700 of some embodiments corresponding to act 1406.

At 1408, a first isolation layer is formed in the trench along the sidewalls and the upper surface of the substrate that define the trench such that the first isolation layer has a large thickness (e.g., greater than about 100 angstroms) and a low density (e.g., about 2.9 to about 3.05 g/cm3). FIG. 8 illustrates a cross-sectional view 800 of some embodiments corresponding to act 1408.

At 1410, the first isolation layer is exposed to a heated environment containing hydrogen gas such that the hydrogen penetrates the first isolation layer and reacts with traps along an interface between the first isolation layer and the substrate to make the traps electrically inactive. FIG. 9 illustrates a cross-sectional view 900 of some embodiments corresponding to act 1410.

At 1412, a second isolation layer is formed over the first isolation layer and lining the first isolation layer. FIG. 10 illustrates a cross-sectional view 1000 of some embodiments corresponding to act 1412.

At 1414, a third isolation layer is formed over the second isolation layer and lining the second isolation layer, the third isolation layer filling the trench. FIG. 11 illustrates a cross-sectional view 1100 of some embodiments corresponding to act 1414.

At 1416, the third isolation layer is planarized. FIG. 12 illustrates a cross-sectional view 1200 of some embodiments corresponding to act 1416.

At 1418, an anti-reflective coating (ARC) layer is formed along the substrate, a color filter is formed over the ARC layer, a composite metal grid (CMG) is formed around the color filter, and a lens is formed over the color filter. FIG. 13 illustrates a cross-sectional view 1300 of some embodiments corresponding to act 1418.

Thus, the present disclosure relates to an image sensor comprising substrate and a trench isolation structure for improving a passivation of the substrate and a performance of the image sensor.

Accordingly, in some embodiments, the present disclosure relates to an image sensor comprising a substrate. A photodetector is in the substrate. A trench is in the substrate. The trench is defined by sidewalls and an upper surface of the substrate. A first isolation layer extends into the trench and laterally surrounds the photodetector. The first isolation layer extends along the sidewalls and the upper surface of the substrate that define the trench. The first isolation layer comprises a first dielectric material. A second isolation layer is over the first isolation layer. The second isolation layer extends into the trench and lines the first isolation layer. The second isolation layer comprises a second dielectric material. A third isolation layer is over the second isolation layer. The third isolation layer fills the trench and lines the second isolation layer. The third isolation layer comprises a third material different from the first dielectric material and the second dielectric material. A ratio of a first thickness of the first isolation layer to a second thickness of the second isolation layer is about 0.17 to 0.38.

In other embodiments, the present disclosure relates to an image sensor comprising a substrate. A photodetector is in the substrate and along a front-side of the substrate. A trench is in the substrate. The trench is defined by sidewalls and an upper surface of the substrate. A first isolation layer extends along a back-side of the substrate and laterally surrounds the photodetector. The first isolation layer consists of a first dielectric. The first isolation layer extends along the sidewalls and the upper surface of the substrate that define the trench. The first isolation layer fills a first portion of the trench. A second isolation layer is over the first isolation layer and laterally surrounds the photodetector. The second isolation layer consists of a second dielectric different from the first dielectric. The second isolation layer extends along the trench and is on sidewalls and an upper surface of the first isolation layer. The second isolation layer fills a second portion of the trench. A third isolation layer is over the second isolation layer and laterally surrounds the photodetector. The third isolation layer consists of a third material different from the first dielectric and the second dielectric. The third isolation layer extends along the trench and is on sidewalls and an upper surface of the second isolation layer. The third isolation layer fills a remainder of the trench. A first density of the first isolation layer is less than a second density of the second isolation layer, and a ratio of the first density to the second density is about 0.35 to 0.37.

In yet other embodiments, the present disclosure relates to a method for forming an image sensor. The method comprises forming a photodetector in a substrate along a first side of the substrate. A second side of the substrate opposite the first side is patterned to form a trench in the second side of the substrate. The trench is defined by sidewalls and an upper surface of the substrate. The trench laterally surrounds the photodetector. A first isolation layer comprising a first dielectric is formed in the trench along the sidewalls and the upper surface of the substrate that define the trench. An alloy process is performed to reduce a trap density at an interface between the first isolation layer and the substrate. A second isolation layer comprising a second dielectric is formed in the trench on sidewalls and an upper surface of the first isolation layer. A third isolation layer comprising a third material is formed in the trench on sidewalls and an upper surface of the second isolation layer. The third isolation layer fills the trench. Forming the first isolation layer comprises depositing the first dielectric at a first temperature, and the first temperature is less than 210 degrees Celsius.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An image sensor comprising:
a substrate;
a photodetector in the substrate;

a first isolation layer laterally surrounding the photodetector and extending along sidewalls and an upper surface of the substrate, the first isolation layer comprising a first metal-oxide;
a second isolation layer comprising a second metal-oxide, different than the first metal-oxide, over the first isolation layer, the second metal-oxide contacting a sidewall and an upper surface of the first metal-oxide; and
a third isolation layer over the second isolation layer and lining the second isolation layer, the third isolation layer comprising a third dielectric different than the first metal-oxide and the second metal-oxide,
wherein a thickness of the first isolation layer is greater than 100 angstroms.
2. The image sensor of claim 1, wherein hydrogen atoms are arranged along an interface between the substrate and the first isolation layer.
3. The image sensor of claim 1, wherein the thickness of the first isolation layer is greater than 100 angstroms between sidewalls of the first isolation layer and wherein the thickness of the first isolation layer is greater than 100 angstroms between upper surfaces and lower surfaces of the first isolation layer.
4. The image sensor of claim 3, wherein the first isolation layer has a density less than 3.05 g/cm3.
5. The image sensor of claim 1, wherein the first metal-oxide consists of aluminum oxide and the second metal-oxide consists of tantalum pentoxide.
6. The image sensor of claim 1, wherein an interlayer dielectric layer is on the sidewalls of the substrate and the upper surface of the substrate, wherein the interlayer dielectric layer separates the substrate from the first isolation layer, wherein the interlayer dielectric layer comprises a second dielectric different than the first metal-oxide, and wherein the first metal-oxide contacts a sidewall and an upper surface of the second dielectric, and wherein the dielectric of the third isolation layer contacts a sidewall and an upper surface of the second metal-oxide.
7. The image sensor of claim 6, wherein a thickness of the interlayer dielectric layer is less than 20 angstroms.
8. The image sensor of claim 1, wherein a ratio of the thickness of the first isolation layer to a thickness of the second isolation layer is about 0.17 to 0.38.
9. An image sensor comprising:
a substrate;
a photodetector in the substrate;
a trench in the substrate that is formed by sidewalls and an upper surface of the substrate;
a first isolation layer extending over the photodetector and laterally surrounding the photodetector, the first isolation layer comprising a first metal-oxide, the first isolation layer extending along the sidewalls of the substrate and the upper surface of the substrate that form the trench, and the first isolation layer filling a first portion of the trench;
a second isolation layer over the first isolation layer and laterally surrounding the photodetector, the second isolation layer comprising a second metal-oxide different than the first metal-oxide, the second isolation layer extending along sidewalls and an upper surface of the first isolation layer, and the second isolation layer filling a second portion of the trench; and
a third isolation layer over the second isolation layer and laterally surrounding the photodetector, the third isolation layer comprising a dielectric different than the first metal-oxide and the second metal-oxide, the third isolation layer extending along sidewalls and an upper surface of the second isolation layer, and the third isolation layer filling a remainder of the trench, wherein the second metal-oxide extends from a sidewall of the dielectric to a sidewall of the first metal-oxide, wherein the first isolation layer has a density less than 3.05 g/cm3, and wherein a distance between a topmost surface of the substrate and a topmost surface of the first isolation layer is greater than 100 angstroms.

10. The image sensor of claim 9, wherein an interlayer dielectric layer is directly between the substrate and the first isolation layer along the sidewalls of the substrate and the upper surface of the substrate, wherein the interlayer dielectric layer comprises a second dielectric, wherein the first metal-oxide extends from a sidewall of the second dielectric to a sidewall of the second metal-oxide.

11. The image sensor of claim 10, wherein a ratio of a thickness of the interlayer dielectric layer to a thickness of the first isolation layer is less than 0.2.

12. The image sensor of claim 9, wherein the first metal-oxide consists of aluminum oxide and hydrogen.

13. The image sensor of claim 9, wherein hydrogen atoms are arranged along an interface between the substrate and the first isolation layer.

14. The image sensor of claim 9, wherein the density of the first isolation layer is less than a density of the second isolation layer, and wherein a ratio of the density of the first isolation layer to the density of the second isolation layer is about 0.35 to 0.37.

15. The image sensor of claim 9, wherein a distance between the substrate and the second isolation layer along the sidewalls of the substrate and the upper surface of the substrate is greater than 100 angstroms.

16. An image sensor comprising:

a substrate, the substrate having a first sidewall, a second sidewall, and a top surface that extends from the first sidewall to the second sidewall;

a photodetector in the substrate between the first sidewall and the second sidewall of the substrate and under the top surface of the substrate;

a first metal-oxide layer comprising a first metal-oxide, the first metal-oxide extending along the first sidewall of the substrate, the second sidewall of the substrate, and the top surface of the substrate;

a second metal-oxide layer comprising a second metal-oxide different than the first metal-oxide, the second metal-oxide on a first sidewall of the first metal-oxide, a second sidewall of the first metal-oxide, a top surface of the first metal-oxide; and an isolation layer comprising a dielectric different than the first metal-oxide and the second metal-oxide, the dielectric on a first sidewall of the second metal-oxide, a second sidewall of the second metal-oxide, a top surface of the second metal-oxide, wherein a thickness of the first metal-oxide layer along the first sidewall of the substrate, the second sidewall of the substrate, and the top surface of the substrate is greater than 100 angstroms, and wherein a density of the first metal-oxide layer is less than 3.05 g/cm3.

17. The image sensor of claim 16, wherein a distance between the top surface of the substrate and the top surface of the first metal-oxide layer is greater than 100 angstroms.

18. The image sensor of claim 16, wherein a distance between the first sidewall of the substrate and the first sidewall of the first metal-oxide is greater than 100 angstroms.

19. The image sensor of claim 16, wherein hydrogen is directly between the first metal-oxide and the substrate along the first sidewall of the substrate, the second sidewall of the substrate, and the top surface of the substrate.

20. The image sensor of claim 16, further comprising:

an interlayer dielectric layer comprising a second dielectric different than the first metal-oxide, the second dielectric on the first sidewall of the substrate, the second sidewall of the substrate, and the top surface of the substrate, wherein the first metal-oxide is on a first sidewall of the second dielectric, a second sidewall of the second dielectric, and a top surface of the second dielectric.

* * * * *